United States Patent [19]

Fuyama et al.

[11] 4,264,682
[45] Apr. 28, 1981

[54] SURFACE HAFNIUM-TITANIUM COMPOUND COATED HARD ALLOY MATERIAL AND METHOD OF PRODUCING THE SAME

[75] Inventors: Moriaki Fuyama; Haruhiko Honda; Mitsuru Ura, all of Hitachi, Japan

[73] Assignee: Hitachi Metals, Ltd., Tokyo, Japan

[21] Appl. No.: 53,731

[22] Filed: Jul. 2, 1979

[30] Foreign Application Priority Data

Oct. 27, 1978 [JP] Japan ............................... 53/132265
Oct. 27, 1978 [JP] Japan ............................... 53/132266
Oct. 27, 1978 [JP] Japan ............................... 53/132267
Oct. 27, 1978 [JP] Japan ............................... 53/132268

[51] Int. Cl.³ .............................................. B32B 15/04
[52] U.S. Cl. .................................... 428/336; 427/249; 427/399; 428/215; 428/217; 428/457; 428/697; 428/698
[58] Field of Search ............... 428/539, 408, 217, 215; 427/249, 399

[56] References Cited

U.S. PATENT DOCUMENTS

| | | | |
|---|---|---|---|
| 4,035,541 | 7/1977 | Smith | 428/539 |
| 4,101,703 | 7/1978 | Schintlmeister | 428/539 |
| 4,169,913 | 10/1979 | Kobayashi | 428/539 |

*Primary Examiner*—Marion McCamish
*Attorney, Agent, or Firm*—Craig & Antonelli

[57] ABSTRACT

A surface coated hard alloy material suitable for use as a material of cutting tools, anti-wear parts or the like in which a high wear resistance, oxidation resistance and anti-weld characteristics are the essential requisites, and a method of producing the same. The material has a substrate made of a cemented carbide, cermet or the like hard material, a first coating layer of a solid solution of a hafnium compound and a titanium compound, and a second coating layer of titanium compound formed on the first coating layer. The coating layers are successively formed in a common reaction system by bringing hafnium tetraiodide and titanium tetraiodide together with a reaction gas into contact with the substrate while the latter is heated by high frequency induction heating, and then introducing only the titanium tetraiodide together with the reaction gas to the substrate, under reduced pressure and in the presence of a glow discharge.

22 Claims, 9 Drawing Figures

SURFACE HAFNIUM-TITANIUM COMPOUND COATED HARD ALLOY MATERIAL AND METHOD OF PRODUCING THE SAME

BACKGROUND OF THE INVENTION

The present invention relates to a method of forming a surface coating layer suitable for cutting tools and anti-wear parts in which a high wear resistance, oxidation resistance and anti-weld characteristic are essential requisites, as well as to a surface-coated hard alloy member produced by the amove-stated method. More particularly, the invention is concerned with a surface-coated cutting tool having superior flank-wear resistance, crater-wear resistance and good adherence between the surface coating layer and the matrix metal, as well as between different layers, which in combination ensures a high cutting performance of the cutting tool, and also concerned with a method of producing such a cutting tool.

Throughout this specification, the term "hard alloy" is used to mean alloys obtained by combining one or more of carbides, nitrides and carbonitride of substances belonging to IV to VI groups of the periodic table by means of one or more of matrix metals such as Co, Ni, W, Mo and Cr, e.g. cemented carbide, cermet and so forth.

A so-called coating tip contains as its major component or base material a cemented carbide which is bonded mainly by cobalt. The base material is coated with one or more coating layers of carbide, nitride or carbonitride of a substance belonging to IV to VI groups of periodic table having a superior wear resistance to the base material, the coating layer or layers usually has a thickness of several microns. This coating tip advantageously exhibits a superior stiffness provided by the base material and a high wear resistance ensured by the surface coating layer. It is well known that this coating tip has a superior cutting performance to that of conventional tool made of cemented carbide.

Recently, however, there is an increasing demand for cutting tools having a long life and further improved cutting performance, as a result of advance and development of processed material, and various tools have been newly developed to cope with this demand. The tendency of switching over from single coating layer to multi-coating layer is an example of this development.

It is well known also that TiC (titanium carbide) coating tip and TiN (titanium nitride) coating tip are most popular among the coating tips heretofore proposed. The TiC coating tip, however, has an inferior crater-wear resistance, although it exhibits a high flank-wear resistance. It is also known that the TiN coating tip, which inherently has a lower hardness than TiC coating tip and, hence, a lower flank-wear resistance than TiC, exhibits a higher chemical stability than TiC which in turn ensures a superior crater-wear resistance. Therefore, it has been proposed to make use of the advantages of these single layers, by suitably combining these layers. For instance, Japanese Patent Laid-open Publication No. 3841/1974 discloses a coating tip having a double coating layer consisting of TiC and TiN layers. This coating tip having double coating layer possesses good flank-wear resistance provided by TiC coating layer and good crater-wear resistance provided by the TiN coating layer.

On the other hand, the cutting of cast article requires a high anti-weld characteristic of the tool. To meet this requirement, the cutting tool has to exhibit a high chemical stability particularly at high temperature. A coating tip having a double coating layer of TiC and $Al_2O_3$, formed by coating the TiC layer with aluminum oxide ($Al_2O_3$) has been proposed as in Japanese Patent Laid-open Publication No. 42029/1976, to cope with demand. In these coating tip having a double coating layer incorporating layers of carbide, nitride and oxide in laminated state, the coating layers are likely to be delaminated or separated, and unfavourable chipping is liable to occur, due to a poor adherence between laminated layers.

Various countermeasures have been proposed to overcome this problem. For instance, Japanese Laid-open Publication No. 60808/1978 proposes to interpose an intermediate layer of titanium oxycarbide TiC.O between the TiC and $Al_2O_3$ layers. Meanwhile, Japanese Patent Laid-open Publication No. 151279/1976 discloses a technique in which, after coating the cemented carbide with carbide, nitride or carbonitride, the cemented carbide with coating layers are subjected to a diffusion treatment and oxidation treatment and, finally, the coating layers are coated with $Al_2O_3$. This process is, however, too complicated and involves danger because of the use of hydrogen as the reaction gas, although it can improve the adherence between adjacent layers considerably.

Under these circumstances, the present inventors have made intense study to find out a material which exhibits a higher flank-wear resistance and crater-wear resistance, as well as higher adherence of the coating layers, than conventional commercially available coating tips.

As a result of the study, the inventors have reached a conclusion that the following items (1) to (4) are essential requisites for the coating material.

(1) To have a high hardness at high temperature.

(2) To have a coefficient of thermal expansion as close as possible to that of the substrate of tip.

(3) To have a high chemical characteristic, i.e. to have a high level of formation free energy.

(4) The cutting edge of the tip well reaches a temperature as high as 800° C. Therefore, the formed oxide of the coating film must be stable and provides a good lubrication between the cutting edge and the cut material. It is also necessary that the oxide effectively prevents diffusion of cut material into the substrate.

The above requisites (1), (2) and (3) are satisfied optimumly by a coating layer of hafnium compound such as HfC, HfN, HfC.N. For instance, the HfC coating layer exhibits a hardness of Hv1000 at 800° C., which is twice as large as that (Hv500) exhibited by the TiC coating layer at the same temperature. The HfC layer is superior to TiC coating layer also in the requisites (2) and (3).

The requisite (4) above can be most suitably met by coating layer of titanium compound such as TiC, TiN and TiC.N. The formed oxide, i.e. titanium oxide $TiO_2$ has a minute structure and, therefore, effectively prevents the cut material from being diffused into the base material of cemented carbide. Namely, it has been confirmed that the coating layer of titanium oxide provides an effective barrier.

The present inventors considered, therefore, to combine the hafnium compound and the titanium compound to obtain a coating tip which possesses both of high flank-wear resistance and crater-wear resistance.

However, at the present stage, almost no study nor research has been made in Japan as to the HfC coating film, because it is extremely difficult to form as compared with the TiC layer. Needless to say, HfC coating tip is not available commercially at all. In the U.S.A., a coating tip having HfC coating film, making use of the technique shown in Japanese Patent Laid-open Publication No. 103848/1974 has been sold since 1971 or so. This technique is to form the HfC film by at first forming the metallic hafnium on the tip substrate by evaporation, gas decomposition, plating and the like method, and then transforming it into HfC by allowing the hafnium to react with carbon such as WC on the tip substrate, by way of a heat treatment.

This reaction is made in accordance with the chemical reaction formula shown below.

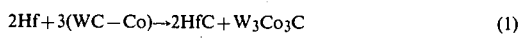

$$2Hf + 3(WC-Co) \rightarrow 2HfC + W_3Co_3C \tag{1}$$

In this case, since the carbon on the substrate surface moves into the Hf layer, $\eta$ phase ($W_3Co_3C$) is liable to be formed on the substrate surface. This $\eta$ phase is extremely fragile and deteriorates the adherence of the film. In addition, it is extremely difficult to control the thickness of the HfC coating film, and a large fluctuation of the thickness is inevitable. For this reason, the advantage inherent in the HfC coating film cannot be effectively utilized, and the cutting tool of this type can have only little practical utility.

Hitherto, it has been attempted to form the HfC film by chemical vapor deposition (CVD) method, making use of methane, hydrogen and hafnium tetrachloride. This process is carried out by heating the base material up to a temperature above 1500° C. Therefore, this coating adversely affects the base material and deteriorates the performance of the coating tip, resulting in a limited use or application of the material. In addition, it is difficult to effect a hydrolysis of the halide of hafnium such as $HfCl_4$ as a decomposition material, so that the work is inconveniently rendered in-efficient.

To overcome this problem, Japanese Patent Laid-open Publication No. 36585/1977 discloses to form a hafnium coating film. According to this process, at first a low grade hafnium halide ($HfCl_3$, $HfCl_2$, $HfCl$) is formed by making the hafnium react with hydrogen chloride and chloride gas. Then, hydrocarbon gas and a carrier gas such as $H_2$, He, Ar, Kr are introduced to effect a thermal decomposition at 900° to 1300° C., thereby to form HfC. In this method, as stated above, a low grade halide is used as the starting material, so that the high grade halide which has been generated is reduced by being passed through hafnium, or is reduced by making use of $H_2$. This process, therefore, involves a highly complicated reaction system and, in addition, suffers an inferior efficiency of work and danger due to the use of a carrier gas such as $H_2$. Further, the HfC coating film is not formed at uniform adherence.

Under these circumstances, the present inventors have developed and established an improved method of making a coating film of hafnium compound which ensures, as will be described later, a minute structure and good adherence of the coating film. According to the invention, a hafnium compound and a titanium compound are suitably combined with each other by making use of this method, so as to provide a surface coated hard alloy material which exhibits, not to mention to the advantages inherent in the hafnium and titanium compounds, a superior performance which can never be presented by the hafnium nor titanium compound solely.

The present inventors have made various studies and researched to put the surface coated hard alloy material coated with hafnium compound into practical use.

As a result, the inventors have found that the hafnium compound is formed easily by at first effecting a reaction of hafnium with halogen to form mainly a high grade halide and then effecting a reaction with a reaction gas such as hydrocarbon supplied into the same reaction system, under the presence of a glow discharge. It has been confirmed also that a titanium compound is formed by the same process allowing a reaction of the titanium halide with the reaction gas such as hydrocarbon. Also, the present inventors have found that the solid solution of a hafnium compound and a titanium compound can be formed by making a simultaneous use of a hafnium halide and a titanium halide as the source material gas and allowing a reaction of these halides with a reaction gas such as hydrocarbon supplied thereto, under the presence of a glow discharge.

The inventors have found that a solid solution of hafnium compound and a titanium compound of a certain composition range provides a superior wear resistance to the single coating layer of hafnium compound and titanium compound. In view of this fact, the inventors have succeeded in developing a coating tip having a double coating layer of a solid solution layer composed of a hafnium compound and a titanium compound, and a layer of a titanium compound formed on this layer of solid solution.

The inventors have confirmed that this coating tip exhibits a superior cutting performance.

The formation of each coating layer basically relies upon chemical vapor deposition method (CVD method) which has been broadly used. However, the present inventors have further improved this method and worked out a method in which the coating reaction is carried out under a reduced pressure in a glow discharge including a plasma discharge. The method for forming the coating layer of the invention, therefore, is more appropriately expressed by a term LPPCVD (Low Pressure Plasma Chemical Vapor Deposition) method. Since this LPPCVD method is carried out under reduced pressure, the coating film formed by this method has a uniform and minute structure. Further, since the reaction is made in a glow discharge, the coating reaction takes place more easily and the formation rate is increased advantageously.

These and other objects, as well as advantageous features of the invention will become more clear from the following description of the preferred embodiments taken in conjunction with the accompanying drawings.

DESCRIPTION OF THE PREFERRED EMBODIMENTS

Hereinafter, a detailed description will be made as to a method of the invention for forming a surface coated hard alloy material. A reference will be made, as an example of the surface coated hard alloy material, to a (Hf.Ti)C+TiC coating, i.e. to a coating having a first coating layer of solid solution of (Hf.Ti)C and a second coating layer of TiC.

Figure 1:
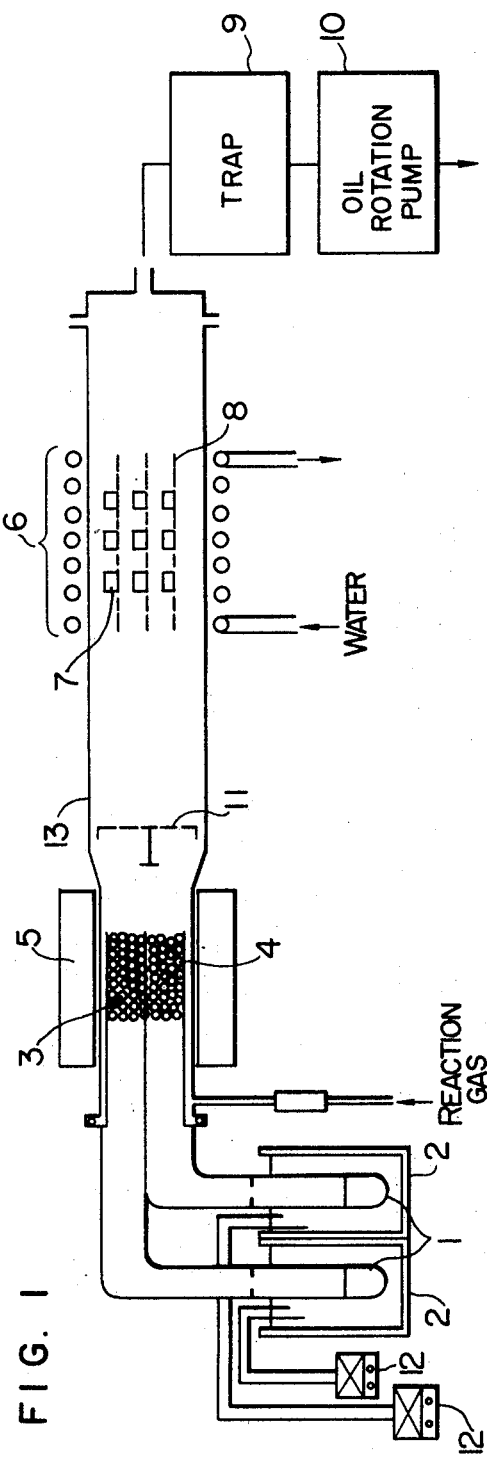
FIG. 1 is a schematic illustration of an example of a system used for carrying out the method of the invention.

FIG. 1 shows a typical example of the apparatus for carrying out the method of the invention. This apparatus has a thermostatic oven 2 adapted to maintain a constant temperature of iodine 1 and to deliver the vapor of iodine at a constant rate. A heating furnace 5 is adapted to heat hafnium 3 and titanium 4 to predetermined temperature. A high frequency induction heating furnace 6 for the substrate is adapted to conduct a reaction of $HfI_4$ or $TiI_4$ with a reaction gas such as hydrocarbon gas, nitrogen gas and ammonia gas, thereby to form hafnium compound and titanium compound. The apparatus further has a substrate holder 8 made of molybdenum and adapted to carry the substrate 8 of the hard alloy. Reference numerals 9, 10, 11, 12 and 13 denote, respectively, a trap, oil rotation pump, gas distribution plate, temperature controller and a reaction tube.

The process of forming the (Hf.Ti)C+TiC coating layer is divided into two steps: a first step of forming the (Hf.Ti)C solid solution and a second step of forming TiC. All steps are successively carried out in the same reaction system.

The first step of forming (Hf.Ti)C is represented by the following reaction formulas.

$$Hf + 2I_2 \rightarrow HfI_4 \quad (2)$$

$$Ti + 2I_2 \rightarrow TiI_4 \quad (3)$$

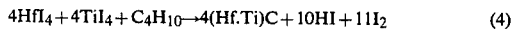

$$4HfI_4 + 4TiI_4 + C_4H_{10} \rightarrow 4(Hf.Ti)C + 10HI + 11I_2 \quad (4)$$

The reactions expressed by the formulas (2) and (3) above are to form hafnium tetraiodide ($HfI_4$) and titanium tetraiodide ($TiI_4$) which are kinds of high grade hafnium halide, by supplying a predetermined amount of iodine vapor $I_2$ into Hf and Ti metals which have been heated up to a predetermined temperature. The formation and composition of this iodide are determined by the temperature to which the Hf and Ti metals are heated. For stably carrying out the reaction of formula (2), the heating temperature is preferably 200° to 600° C. In this example, the Hf metal was heated up to about 300° C., taking into account the simultaneous formation of the titanium iodide, as will be stated later.

The Hf metal as used preferably has a form of a sponge, more preferably a sponge of regular or uniform grain size, although the Hf metal can have other forms such as chip-like form and grains.

The Hf metal (particularly Hf sponge) used as the source contains about 1% of zirconium. The small amount of zirconium halide coexisting with the hafnium halide does not adversely affect at all the characteristic of the surface coated hard alloy material. The invention does not exclude the presence of such a trace amount of compounds of additional metal in the final product.

For stably carrying out the reaction of equation (3), it is preferred to heat Ti up to a temperature above 200° C. As to the titanium iodide, however, different iodides are formed depending on the temperature. More specifically, $TiI_4$ is formed at a temperature of 200° to 300° C., while $TiI_3$ and $TiI_2$ are formed at a temperature above 350° C. The iodides $TiI_2$ and $TiI_3$ cannot be used suitably, because the vapor pressures are too low, and it is necessary to use $TiI_4$ having a high vapor pressure. For this reason, the heating temperature of Ti is preferably 200° to 350° C. However, the heating temperature is more preferably about 300° C., taking into account the simultaneous formation of hafnium iodide.

The reaction of formula (4) is carried out by introducing $HfI_4$ and $TiI_4$ which have been formed separately to the substrate which has been heated up to a predetermined temperature, together with a reaction gas $C_4H_{10}$, thereby to form (Hf.Ti)C on the substrate.

The heating temperature (reaction temperature) of the substrate is preferably 850° C. to 1250° C. The temperature below 850° C. cannot provide a film having a sufficient wear resistance, although it permits the formation of (Hf.Ti)C. To the contrary, since the liquidus temperature of the substrate (WC-CO) is around 1270° C., the heating temperature above 1250° C. deteriorates the characteristic of the substrate and, therefore, is not preferred. At the same time, the crystal grains of the resulted (Hf.Ti)C films are rendered columnar grains to prevent the formation of minute structure, causing roughening of the surface and chipping during cutting.

The composition of the intermediate layer of (Hf.Ti)C can optionally be controlled as desired. More specifically, the Hf/Ti gas concentration in the source gas can be changed by changing the amount of formation of $HfI_4$ and $TiI_4$ through controlling the amount of $I_2$ supplied into Ti and Hf, so that (Hf.Ti)C solid solution can easily be generated. This fact has been confirmed through X-ray diffraction. The (Hf.Ti)C solid solution film is thus formed to the desired thickness.

The second step of forming TiC on (Hf.Ti)C is then commenced. This step is effected simply by stopping the supply of $I_2$ vapor which is being introduced into the Hf metal. Thus, the reaction formulas for the reaction of this step are as follows.

$$Ti + 2I_2 \rightarrow TiI_4 \quad (5)$$

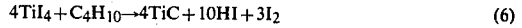

$$4TiI_4 + C_4H_{10} \rightarrow 4TiC + 10HI + 3I_2 \quad (6)$$

It was found that the condition for formation of the (Hf.Ti)C is directly applied to the formation of TiC. Therefore, the adherence at the boundary layer between (Hf.Ti)C and TiC is made perfect, as the introduction of $I_2$ vapor into the Hf metal is gradually decreased, after forming the (Hf.Ti)C film to the desired thickness. The $I_2$ vapor introduction is ceased after the TiC has been formed to the desired thickness, to complete the whole process.

Figure 2:
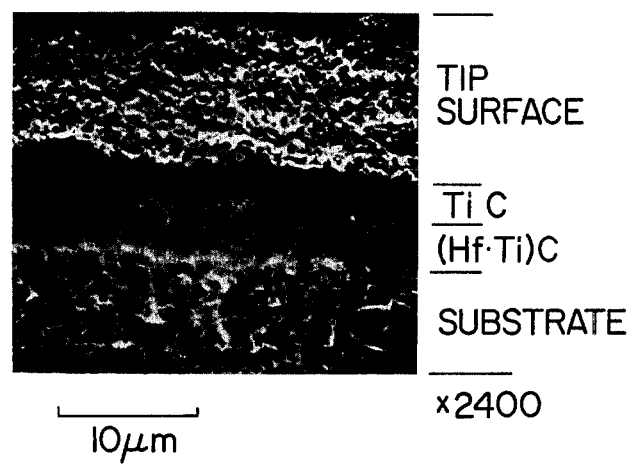
FIG. 2 is a photograph of the layer construction of a coating tip taken by a scanning electron microscope.

A scratching test with a diamond was effected on the (Hf.Ti)C+TiC coating tip formed in the manner described. No spalling was observed during the test. Also, a perfect adherence was observed between each adjacent layers of different compositions, as will be seen from FIG. 2 showing a photograph of the layer construction of the coating tip thus formed, taken by a scanning electron microscope.

In the described method of producing a surface coated hard alloy material, (Hf.Ti)C and TiC are used as the materials of the first and the second coating layers. These materials, however, are not exclusive. Also, the source gases $HfI_4$ and $TiI_4$ are not described in limiting sense, nor the $C_4H_{10}$ as the reaction gas is not exclusive.

Namely, the invention is based upon a discovery of a measure which permits a thermal decomposition of a high grade halide such as $HfI_4$, without using low grade halide such as $HfI_3$, $HfI_2$ and so forth. More specifically, the method of the invention comprises the steps of forming high grade halides as the source gases, bringing at least one of hydrocarbon, nitrogen and ammonia gas as a reaction gas into contact with the source gases, thermally decomposing the mixture gas at a predetermined temperature thereby to coat the substrate of the hard alloy with hafnium compound (HfC, HfN, HfC.N), titanium compound (TiC, TiN, TiC.N), and solid solution of hafnium compound and titanium compound ((Hf.Ti)C, (Hf.Ti)N, (Hf.Ti)C.N) and so forth.

As the high grade halide used as the source gas, iodides such as hafnium tetraiodide, titanium tetraiodide can be used more suitably than chlorides, because the latter usually exhibits a higher thermal decomposition temperature than the former. In addition, when a chloride is used, it is necessary to reduce the chloride by $H_2$ to form low grade chloride ($HfCl_3$, $TiCl_2$) before the thermal decomposition, while, in case of iodides, it is not necessary to use $H_2$. According to the invention, the use of $H_2$ as a carrier gas is not essential, although a high grade halide is used, because of the use of a glow discharge under a reduced pressure, as will be described later. The elimination of use of $H_2$ ensures the safety of the work and eliminates the disposal of waste gas.

According to the invention, high grade halides are mainly used as the source gases, and the performance of the surface coated hard alloy material is never affected even if a slight amount of low grade halide exists together with the high grade halide. The invention, therefore, does not exclude the coexistence of the high grade halide with a small amount of low grade halide.

According to the invention, the mixture gas of a source gas and a reaction gas is introduced to a substrate which has been heated up to 850° to 1250° C. so as to form coating layer.

For obtaining a good result, according to the invention, the heating during formation of the first coating layer is carried out in two successive stages: a first stage of heating from 1050° C. to 1250° C. which causes mutual diffusion of the substrate and the first layer with each other to improve the adherence, and a second stage of heating from 850° C. to 1050° C. for forming wear resistant coating film having a minute structure and a desired thickness. A heating temperature below 1050° C. in the first stage cannot provide a sufficient adherence, while a temperature above 1050° C. in the second stage cannot provide smooth coating layer and often results in a chipping. Further, it is difficult to obtain a wear resistant coating film by a heating at a temperature below 850° C.

Preferably, the adherence between the substrate and the first coating film is improved at about 1100° C. and then the temperature is lowered to about 950° C. to form a minute and wear-resistant coating film having the desired thickness is formed. The second coating film formed in the course of the production of the double coat hard alloy material is formed with good adherence to the first film, because they are formed in the same reaction system as the first step. The heating temperature in the second step, therefore, may be as low as about 850° C. to 1050° C.

According to the invention, the coating is effected under a reduced pressure of less than 1 Torr, because the pressure in excess of 1 Torr cannot provide minuteness nor wear resistance of the coating film. As in the case of the heating temperature, the pressure in the first step may be changed over two stages: a first stage of 0.1 to 1.0 Torr and a second stage of 0.1 Torr or less. The pressure below 0.1 Torr cannot provide a sufficient adherence between the substrate and the coating film. Therefore, the first stage is performed at a pressure of between 0.1 and 1.0 Torr, so that the adherence between the substrate and the coating film may be improved. The pressure above 0.1 Torr is liable to generate columnar grains, although it provides a sufficient adherence. The second stage, therefore, is performed to permit a uniform growth to the desired thickness, at a pressure below 0.1 Torr.

Preferably, from the view points of adherence and minuteness, the first stage is carried out at about 0.2 Torr, and the second stage is carried out at about 0.05 Torr for uniform growth of the film. The second step is carried out under a reduced pressure of 0.1 Torr or less, for the same reason as the case of the previously described heating temperature. According to the invention, it is possible to uniformly coat the substrate, because the coating is carried out under a reduced pressure.

In the method of the invention, the formation of the hafnium compound and so forth is made in a glow discharge, so that a fine or minute structure of the coating layer may be formed. The glow discharge may be positively produced by combining high frequency induction heating means under reduced pressure. For instance, the glow discharge is caused at 6 kV×1.2 A under reduced pressure of 0.2 Torr. In this case, the resultant coating layer has a minute structure.

Figure 3:
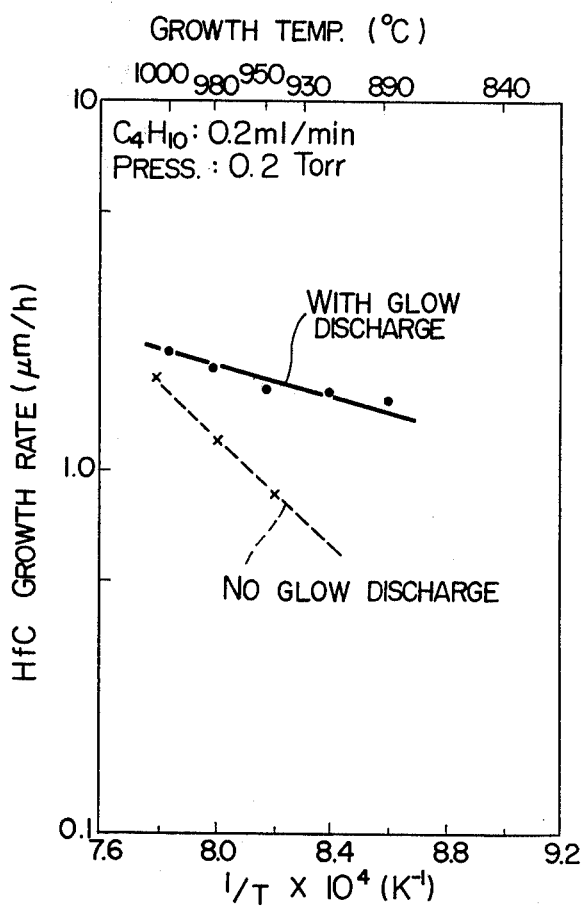
FIG. 3 is a diagram showing the rate of growth of coating film under a glow discharge.

FIG. 3 shows examples of rates of growth of HfC as observed when the glow discharge is employed and not employed during the coating operation. It will be seen that the activation energy of HfC as observed when the coating is effected under the glow discharge is 12 Kcal/mol which is much smaller than that (35 Kcal/mol) observed when no glow discharge is used. It will be seen that the formation or deposition of the HfC is facilitated and the deposition speed is increased by the use of the glow discharge.

In order to make a positive use of the abovementioned glow discharge, the induction heating system which permits a rapid heating of the substrate is preferably used as the system for heating the substrate. The induction heating also provides a high efficiency of use of the source gas, because this heating method permits the heating of only the substrate. To the contrary, the resistance heating can provide only a low efficiency of use of the source gas and, at the same time, makes the maintenance work of the reaction furnace difficult and troublesome, because this heating method allows an easy attaching of deposits on the reaction tube.

When the induction heating system is used as the heating system, it is a common measure to use an insulating body such as quartz holder as the holder which permits a deposition over the entire surface of the substrate. The shaping and processing of this holder, however, are extremely difficult. Therefore, the inventors have considered to use a gauze wire of molybdenum. By placing the molydenum gauze wire in parallel with the magnetic field and mounting the substrate on this gauze wire, it is possible to heat only the substrate, while avoiding the distribution of the induced power to the gauze wire, so that the substrate is coated uniformly over the entire surface thereof.

The present inventors have made various studies to obtain a coating tip having good wear resistance and oxidation resistance, as well as a high anti-weld characteristic, particularly a coating tip having a good flank wear resistance and crater wear resistance and a high adherence between the different coating layers and the coating layer and the substance.

As a result, the inventors have reached a conclusion that the solid solution of a hafnium compound and a titanium compound is most suitably used as the material for the first coating layer, because this solid solution has a coefficient of thermal expansion approximating that of the substrate so as to ensure a high impact strength and a high anti-spalling characteristic, and because this solid solution has a high wear resistance, high chemical stability and a high hardness at the high temperature.

As to the second layer formed on the first coating layer, the present inventors have found that the titanium compound film can advantageously used, because the oxide thereof generated under high temperature during cutting is stable and provides a good lubrication between the coating tip and the material processed and, further, effectively prevents the diffusion of the material processed into the coating tip.

The advantage of the solid solution layer of the hafnium compound and the titanium compound, as well as the superior performance of the surface coated hard alloy material can be utilized only by the production in accordance with the coating method of the invention. In the double-coated hard alloy material of the invention, the thickness of the solid solution layer of hafinium compound and titanium compound preferably falls within the region of between 1 and 10 μm, while the second coating layer of titanium compound has a thickness which preferably falls within a range of between 1 and 10 μm. Thus, the total thickness of the coating layers is preferably 2 to 20 μm.

Hereinafter, a description will be made as to a single-coat coating tip (HHf.Ti)C and a double-coat coating tip ((Hf.Ti)C+TiC, (Hf.Ti)N+TiN) which are typical embodiments of the invention. Needless to say, however, these embodiments are not exclusive, and can be applied to various other uses including cutting tools and anti-wear parts which are required to have high wear resistance, oxidation resistance and anti-weld characteristic.

EMBODIMENT

Figure 4:
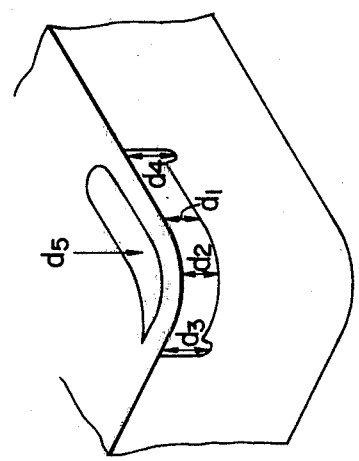
FIG. 4 illustrates various kinds of wear.

A dry cutting test was conducted to compare the performances of a conventional commercially available coating tip, reference coating tips and coating tips of the invention. A commercially available TiC coating tip was used as the example of the conventional coating tip, while coating tips having a single layer of HfC or HfN, respectively, which were formed by a specific coating method developed by the present inventors in the course of studies for accomplishing the present invention, were used as the reference coating tips. The result of this test is shown in Table 2. The cutting condition was as follows, and the shape of tip was SNGN 432 EM.

material machined: JIS SCH-3 (Hs35)
cutting speed: 140 m/min.
feed: 0.3 mm/rev.
cut depth: 1.5 mm Referring to table 2, symbols $d_1$, $d_2$, $d_3$, $d_4$ and $d_5$ represent the mean flank wear, end flank wear, front grooving flank wear, lateral grooving flank wear and crater wear, respectively, which were observed after a 60 minutes continuous cutting operation, as shown in FIG. 4.

The coating was effected successively with (Hf.Ti)C and TiC on a cemented carbide substrate of 72WC-9Co-8TiC-11TaC wt% (P30 grade) to form a double coating layer, in accordance with the conditions as shown in Table 1. Other coated products have been treated under conditions following the conditions shown in Table 1.

It has been confirmed from lattice constant by means of an X-ray diffraction that the composition of the (Hf.Ti)C of the intermediate layer is 60TiC-40HfC(mol%).

TABLE 1

Coating conditions

| | | Coatings | |
|---|---|---|---|
| | | (Hf . Ti)C | TiC |
| Reaction temperature | °C. | 1100–950 | 950 |
| Reaction pressure | Torr | 0.2–0.05 | 0.05 |
| $C_4H_{10}$ flow rate | ml/min | 0.2 | 0.2 |
| Hf heating temp. | °C. | 300 | — |
| Ti heating temp. | °C. | 300 | 300 |
| $I_2$ evaporation rate (Hf side) | mg/min | 20 | — |
| $I_2$ evaporation rate (Ti side) | mg/min | 7 | 16 |
| Coating thickness | μm | 1 | 2 |

TABLE 2

Result of dry cutting test

| | Coating | Wear (mm) | | | | |
|---|---|---|---|---|---|---|
| | | $d_1$ | $d_2$ | $d_3$ | $d_4$ | $d_5$ |
| A | TiC (5 μm) | 0.16 | 0.31 | 0.26 | 0.20 | 0.17 |
| B | HfC (5 μm) | 0.07 | 0.12 | 0.305 | 0.41 | 0.05 |
| | HfN (5 μm) | 0.075 | 0.12 | 0.31 | 0.42 | 0.045 |
| | (Hf . Ti)C (5 μm) | 0.07 | 0.15 | 0.28 | 0.24 | 0.06 |
| C | (Hf . Ti)C + TiC 3 μm    2 μm | 0.08 | 0.18 | 0.22 | 0.19 | 0.07 |
| | (Hf . Ti)N + TiN 3 μm    2 μm | 0.06 | 0.16 | 0.22 | 0.17 | 0.055 |

A: conventional coating tip,
B: reference coating tips,
C: coating tips of invention,
$d_1$: mean flank wear,
$d_2$: end flank wear,
$d_3$: front grooving flank wear,
$d_4$: lateral grooving flank wear,
$d_5$: crater wear (maximum depth)

From Table 2, it will be understood that the coating tip of the invention has a superior grooving-wear resistance to the conventional TiC coating tip, and exhibits a high mean flank wear resistance, end flank wear resistance, and crater wear resistance. Thus, the coating tip of the invention has a high quality and exhibits a stable superior performance.

It will be also seen that the coating tip of the invention exhibits a superior performance to the reference coating tip which is superior to the conventional TiC coating tip in mean flank wear resistance, end flank wear resistance and crater wear resistance, but is rather inferior to the same in grooving wear resistance. A scratching test was conducted before turning to the dry cutting test, in order to examine the adherence of coating films in the coating tips of the invention, and a good adherence was confirmed as a result of this test.

Figure 5:
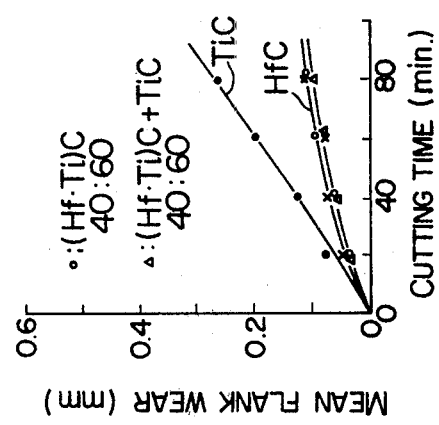
FIGS. 5 to 7 show, respectively, how the mean flank wear, front boundary flank wear and crater wear are changed as the cutting time grows long, when the material processed is SCM3.
Figure 6:
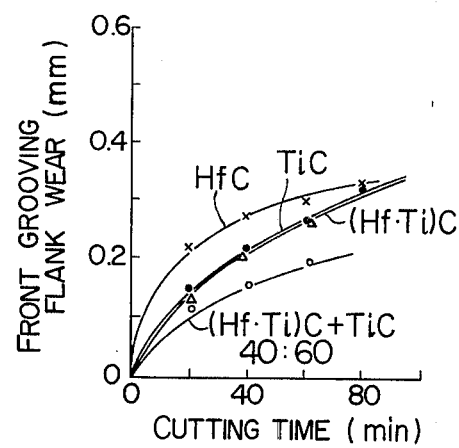
Figure 7:
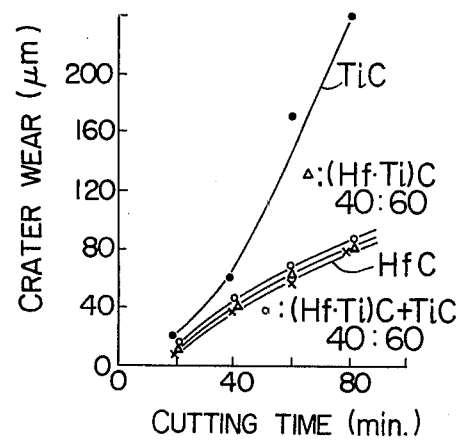

FIGS. 5 to 7 show how the mean flank wear, front grooving flank wear and the crater wear are changed in relation to time, for each of the TiC coated conventional tool, reference tool having HfC coating layer and the tool of the invention having the (Hf.Ti)C, (Hf.Ti)C+TiC coatings.

From these Figures, it will be understood that the coating tip of the invention is much superior to the conventional and reference coating tips.

As a result of a dry and wet cutting test conducted on a JIS SCM3 as the material machined, the coating tip of the invention exhibits a tool life which is about twice as long as that of the conventional TiC coating tip. It has also been confirmed that the coating tip of the invention exhibits a much higher superiority to the conventional one, when a cast material (FCD 50) is used as the material machined.

Figure 8:
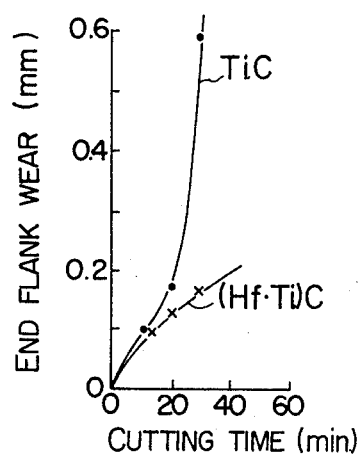
FIGS. 8 to 9 show, respectively, how the end flank wear and front boundary wear are changed as the cutting time grows long, when the material processed is a cast product.
Figure 9:
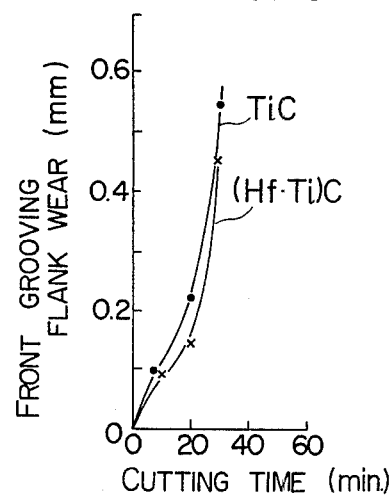

FIGS. 8 and 9 show how the end flank wear and front grooving flank wear grow in relation to the cutting time, for each of TiC coating tip and (Hf.Ti)C coating tip, when the material processed is a cast product (FCD 50). From these Figures, it will be understood that even the (Hf.Ti)C single coating tip is superior to the conventional TiC coating tip, not only in the mean flank wear, end flank wear and crater wear, but in the grooving wear as well.

As stated before, the solid solution of hafnium compound and titanium compound of a certain composition region exhibits a performance superior to the single coating of hafnium compound or titanium compound. The table 3 below shows how the tool life is changed by the change in the composition of solid solution film.

Condition of continuous cutting test
material machined: SCM 3 (Hs40−43)
cutting speed: 140 m/min.
cutting depth: 1.5 mm
feed: 0.3 mm/rev.

The cutting time length until the flank wear width $V_B$ of 0.4 mm and crater depth $K_T$ of 0.2 mm are reached was used as the standard for the judgement of the tool life.

TABLE 3

| | Result of cutting test | |
|---|---|---|
| | Composition of film (mol %) | tool life in continuous cutting (min.) |
| Coating tip of Invention | 90TiC - 10HfC | 50 |
| | 80TiC - 20HfC | 65 |
| | 60TiC - 40HfC | 80 |
| | 40TiC - 60HfC | 75 |
| | 20TiC - 80HfC | 60 |
| | 10TiC - 90HfC | 50 |
| Conventional coating tip | TiC | 45 |
| Reference coating tip | HfC | 50 |

The thicknesses of the films including those of reference tool were 5 μm.

It was found that the TiC film exhausted the tool life by the crater wear, while HfC film exhausted the tool life by the flank wear, particularly the grooving flank wear. The tool lives of 90TiC-10HfC film and 10HfC-90HfC films were exhausted, respectively, by the crater wear and the grooving flank wear.

This means that the tool lives of the former and the latter are ruled by the wear characteristics of TiC film and HfC film, respectively, and no remarkable effect are brought about by these compositions of the solid solution.

However, the tool of the invention having the solid solution coating film with a composition ranging between 80TiC-20HfC and 20TiC-80HfC exhibits a remarkably improved wear characteristics, making efficient use of the flank-wear resistance provided by the TiC film and the crater wear-resistance performed by the HfC film.

Although the invention has been described with specific reference to a surface coated cutting tool, needless to say, the invention can equally be applied to various other uses such as anti-wear parts which are required to have a high wear resistance, oxidation resistance and anti-weld characteristic.

What is claimed is:

1. A surface coated hard alloy material characterized by comprising a substrate of a hard alloy material such as cemented carbide, cermet or the like, and a coating layer coating said substrate, said coating layer being composed of a solid solution of a hafnium compound and a titanium compound.

2. A surface coated hard alloy material as claimed in claim 1, wherein said solid solution is constituted by hafnium-titanium carbide (Hf.Ti)C, hafnium-titanium (Hf.Ti)N and hafnium-titanium carbonitride (Hf.Ti)C.N.

3. A surface coated hard alloy material characterized by comprising a substrate of a hard alloy material such as cemented carbide, cermet or the like, a first coating layer coating said substrate and composed of a solid solution of hafnium compound and a titanium compound, and a second coating layer of a titanium compound formed on said first coating layer.

4. A surface coated hard alloy material as claimed in claim 3, wherein said hafnium compound is constituted by a hafnium carbide HfC, hafnium nitride HfN and hafnium carbonitride HfC.N, said titanium compound is constituted by a titanium carbide TiC, titanium nitride TiN and titanium carbonitride TiC.N, and said solid solution is constituted by hafnium-titanium carbide (Hf.Ti)C, hafnium-titanium nitride (Hf.Ti)N and hafnium-titanium carbonitride (Hf.Ti)C.N.

5. A surface coated hard alloy material as claimed in claim 3, wherein said first coating layer constituted by said solid solution of said hafnium compound and said titanium compound has a thickness of between 1 and 10 μm, and said second coating layer of said titanium compound has a thickness of between 1 and 10 μm, so that said coating layers provide a total thickness of 2 to 20 μm.

6. A surface coated hard alloy material as claimed in claim 3, wherein said solid solution of said first coating layer is compose of hafnium-titanium carbide having a mol% of HfC to TiC falling within the range of between 20:80 and 80:20, while said titanium compound constituting said second coating layer is titanium carbide.

7. A surface coated hard alloy material which is produced by a process having the steps of: forming mainly a high grade halide, introducing at least one of hydrocarbon gas, nitrogen gas and ammonia gas into said high grade halide, and introducing the mixture gas to an induction heated substrate of a hard alloy material, so as to form on said substrate under reduced pressure in the presence of a glow discharge, a solid solution of a hafnium compound and a titanium compound, and, on said solid solution, a titanium compound, said steps being performed successively in a common reaction system.

8. A method of producing a surface coated hard alloy material comprising the steps of: forming mainly a high grade hafnium halide and/or a high grade titanium halide as a source gas or gases, introducing at least one of hydrocarbon gas, nitrogen gas and ammonia gas as a reaction gas, and introducing the mixture gas to a substrate of the hard alloy which has been heated to 850° C. to 1250° C. so as to form on said substrate at least one of a hafnium compound, titanium compound and a solid solution of hafnium compound and titanium compound, under a reduced pressure of not higher than 1 Torr, in the presence of a glow discharge, said steps being taken place successively in a common reaction system.

9. A method of producing a surface coated hard alloy material as claimed in claim 8, wherein said high grade hafnium halide and said high grade titanium halide are hafnium tetraiodide $HfI_4$ and titanium tetraiodide $TiI_4$, respectively.

10. A method of producing a surface coated hard alloy material as claimed in claim 8, wherein said substrate is heated by a high frequency induction heating means.

11. A method of producing a surface coated hard alloy material as claimed in claim 8, wherein the hydrocarbon gas is used as said reaction gas.

12. A method of producing a surface coated hard alloy material as claimed in claim 8, wherein the heating of said substrate for forming the first coating layer on said substrate is made in two stages of a first stage in which the heating temperature is 1050° C. to 1250° C. and a second stage in which the heating temperature is 850° C. to 1050° C.

13. A method of producing a surface coated hard alloy material as claimed in claim 12, wherein the temperatures in said first and second stages are about 1100° C. and about 950° C., respectively.

14. A method of producing a surface coated hard alloy material as claimed in claim 8, wherein the pressure reduction during the formation of the first coating layer on said substrate is conducted in two stages of a first stage in which the pressure is maintained between 0.1 Torr and 1.0 Torr and a second stage in which the pressure is maintained below 0.1 Torr.

15. A method of producing a surface coated hard alloy material as claimed in claim 14, wherein the pressures in said first and second stages are about 0.2 Torr and about 0.05 Torr, respectively.

16. A method of producing a surface coated hard alloy material as claimed in claim 8, wherein said hafnium compound is one or more of hafnium carbide HfC, hafnium nitride HfN and hafnium carbonitride HfC.N, said solid solution is one or more of hafnium-titanium carbide (Hf.Ti)C, hafnium-titanium nitride (Hf.Ti)N and hafnium-titanium carbonitride (Hf.Ti)C.N, and said titanium compound is one or more of titanium carbide TiC, titanium nitride TiN and titanium carbonitride TiC.N.

17. A method of producing a surface coated hard alloy material as claimed in claim 8, wherein said substrate is placed on a substrate holder which is constituted by a gauze wire disposed to extend in parallel with the magnetic field.

18. A method of producing a surface coated hard alloy material as claimed in claim 8, wherein hafnium and a halogen are made to react at 200° C. to 600° C. with each other to form mainly a high grade hafnium halide, and titanium and a halogen are made to react with each other at 200° C. to 350° C. to form mainly a high grade titanium halide.

19. A method of producing a surface coated hard alloy material as claimed in claim 8, wherein said material gases are hafnium tetraiodide $HfI_4$ and titanium tetraiodide $TiI_4$, and said reaction gas is one of hydrocarbon gas, nitrogen gas and ammonia gas, while the heating is conducted by a high frequency induction in two stages of a first stage in which the temperature is maintained at 1050° C. to 1250° C. and a second stage in which the temperature is maintained at 850° C. to 1050° C., and the reduced pressure is changed in two stages of 0.1 Torr to 1.0 Torr and below 0.1 Torr, and a solid solution of hafnium compound and titanium compound are formed on the substrate in the presence of a glow discharge.

20. A method of producing a surface coated hard alloy material as claimed in claim 8, wherein the following steps are successively performed in a common reaction system:

(i) a first step which consists in forming mainly hafnium tetraiodide $HfI_4$ and titanium tetraiodide $TiI_4$ as source gases, introducing at least one of hydrocarbon gas, nitrogen gas and ammonia gas as the reaction gas, and introducing the mixture gas to substrate of said hard alloy while heating said substrate by a high frequency induction heating means in two stages: a first stage of 1050° C. to 1250° C. and second stage of 850° C. to 1050° C., said first and second stages of heating being made under reduced pressures of 0.1 to 1.0 Torr and below 1.0 Torr, respectively, so as to coat said substrate with solid solution of hafnium compound and titanium compound in the pressence of a glow discharge; and (ii) a second step which consists in forming mainly titanium tetraiodide as a source gas, introducing at least one of hydrocarbon gas, nitrogen gas and ammonia gas as a reaction gas, and introducing the mixture gas to said substrate while heating the latter by said high frequency induction heating means to a temperature of 850° C. to 1050° C., so as to coat said solid solution of said hafnium compound and said titanium compound, which has been formed in said first step, with the titanium compound under a reduced pressure of below 0.1 Torr and in the presence of a glow discharge.

21. A method of producing a surface coated hard alloy material as claimed in claim 20, wherein hydrocarbon is used as the reaction gas, and the mol% of HfC to TiC of hafnium-titanium carbide which constitutes said solid solution is adjusted to fall within the range of between 20:80 and 80:20, by adjusting the rate of supply of said hafnium tetraiodide $HfI_4$ and titanium tetraiodide $TiI_4$ in the first step.

22. A method of producing a surface coated hard alloy material as claimed in claim 21, wherein the mol% of HfC to TiC of said hafnium-titanium carbide is about 40:60.

* * * * *

UNITED STATES PATENT AND TRADEMARK OFFICE
CERTIFICATE OF CORRECTION

PATENT NO. : 4,264,682

DATED : April 28, 1981

INVENTOR(S) : Moriaki Fuyama; Haruhiko Honda; Mitsuru Ura

It is certified that error appears in the above—identified patent and that said Letters Patent is hereby corrected as shown below:

On the Title Page, left-hand column, under Foreign Application Priority Data, after "Oct. 27, 1978 [JP]   Japan ........53/132268", insert:

--April 24, 1979 [JP]   Japan.............54/50406

May 30, 1979 [JP]   Japan.............54/67116--

Signed and Sealed this

Twenty-seventh Day of October 1981

[SEAL]

Attest:

GERALD J. MOSSINGHOFF

*Attesting Officer*            *Commissioner of Patents and Trademarks*